(12) United States Patent
Eickelmann et al.

(10) Patent No.: US 11,024,761 B2
(45) Date of Patent: Jun. 1, 2021

(54) MECHANICALLY STACKED, LATERAL MULTI-JUNCTION PHOTOVOLTAIC CELLS

(71) Applicant: INTERNATIONAL BUSINESS MACHINES CORPORATION, Armonk, NY (US)

(72) Inventors: Hans-Juergen Eickelmann, Mainz (DE); Ruediger Kellmann, Mainz (DE); Markus Schmidt, Mainz (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 172 days.

(21) Appl. No.: 15/156,488

(22) Filed: May 17, 2016

(65) Prior Publication Data
US 2017/0338364 A1 Nov. 23, 2017

(51) Int. Cl.
*H01L 31/043* (2014.01)
*H01L 31/046* (2014.01)
*H01L 31/054* (2014.01)

(52) U.S. Cl.
CPC .......... *H01L 31/046* (2014.12); *H01L 31/043* (2014.12); *H01L 31/0549* (2014.12); *Y02E 10/52* (2013.01)

(58) Field of Classification Search
USPC ................................................. 136/243–265
See application file for complete search history.

(56) References Cited

U.S. PATENT DOCUMENTS

| 6,951,819 | B2 | 10/2005 | Iles et al. |
| 8,153,888 | B2 | 4/2012 | Smith et al. |
| 2004/0084077 | A1* | 6/2004 | Aylaian |
| 2010/0170556 | A1* | 7/2010 | Frolov ........ H02S 40/34 136/244 |

(Continued)

OTHER PUBLICATIONS

Velten et al., "Roll-to-Roll Hot Embossing of Microstructures", May 2010, https://www.researchgate.net/publication/226618937_Roll-to-roll_hot_embossing_of_microstructures (7 pages).

(Continued)

*Primary Examiner* — Dustin Q Dam
(74) *Attorney, Agent, or Firm* — Tihon Poltavets, Esq.; Kevin P. Radigan, Esq.; Heslin Rothenberg Farley & Mesiti P.C.

(57) ABSTRACT

Lateral multi-junction photovoltaic cells, devices, and methods of fabrication are provided. The photovoltaic cells include a plurality of photovoltaic subcells mechanically stacked together in a stack. Each photovoltaic subcell includes a subcell substrate, and a light absorption structure associated with the substrate. Each light absorption structure is optimized for a respective defined spectral range of incoming radiation, with the light absorption structures of multiple subcells of the plurality of photovoltaic subcells being optimized for different spectral ranges, and being offset in the stack relative to an optical axis to avoid overlap. The photovoltaic cell further includes a spectrally-dispersive optical element, with the photovoltaic subcells in the stack being respectively located and aligned relative to the optical element based, at least in part, on the respective spectral ranges of the subcells' light absorption structures.

17 Claims, 7 Drawing Sheets

(56) References Cited

U.S. PATENT DOCUMENTS

2016/0111585 A1* 4/2016 Chen

OTHER PUBLICATIONS

Maragliano et al., "Point-Focus Spectral Splitting Solar Concentrator for Multiple Cells Concentrating Photovoltaic System", Journal of Optics, vol. 17, Apr. 2015 (13 pages).
"Full-Spectrum Solar Cells", http://nanophotonics.asu.edu/full-spectrum%20solar%20cell.htm, downloaded Aug. 12, 2015 (2 pages).
Schott North America, Inc., "Ultra-Thin Glass for Electronics Applications", http://www.us.schott.com/advanced_optics/english/download/schott-ultra-thin-glass-electronics-appl-nov-2015-us.pdf, downloaded Nov. 2015 (2 pages).

* cited by examiner

MECHANICALLY STACKED, LATERAL MULTI-JUNCTION PHOTOVOLTAIC CELLS

BACKGROUND

A lateral multi-junction photovoltaic (or solar) cell architecture is appealing for a number of reasons. For instance, a lateral photovoltaic cell architecture increases the choice of materials for multiple junction photovoltaic cells, since it avoids lattice and current matching constraints. Further, since the devices do not need to be series connected, spectral mismatch losses are reduced. In addition, by contacting the individual photovoltaic cells with individual voltage buses, the need for tunnel junctions is avoided. Since each material requires unique (and transparent) tunnel junction contact metallurgy, eliminating tunnel junctions represents a substantial simplification. In general, a multi-junction, monolithic, photovoltaic cell or device advantageously converts solar radiation to photocurrent and photovoltage with improved efficiency. However, fabrication of a monolithic, lateral multi-junction photovoltaic cell architecture involves fairly complex and expensive fabrication processing.

SUMMARY

The shortcomings of the prior art are overcome and additional advantages are provided through the provision of a lateral multi-junction photovoltaic cell, which includes, for instance: a plurality of photovoltaic subcells, the plurality of photovoltaic subcells beings mechanically stacked together in a stack, each photovoltaic subcell including a subcell substrate, and a light absorption structure associated with the subcell substrate, the light absorption structure being optimized for a respective spectral range of incoming radiation, and wherein the light absorption structures of multiple photovoltaic subcells of the plurality of photovoltaic subcells are optimized for different spectral ranges, and are laterally offset in the stack relative to an optical axis to avoid overlap; and a spectrally-dispersive optical element, the plurality of photovoltaic subcells of the stack being respectively located and aligned relative to the spectrally-dispersive optical element based, at least in part, on the respective spectral ranges of the subcells' light absorption structures.

In another aspect, a photovoltaic device is provided which includes at least one lateral multi-junction photovoltaic cell. The at least one lateral multi-junction photovoltaic cell includes, for instance: a plurality of photovoltaic subcells, the plurality of photovoltaic subcells being mechanically stacked together in a stack, each photovoltaic subcell including a subcell substrate, and a light absorption structure associated with the subcell substrate, the light absorption structure being optimized for a respective spectral range of incoming radiation, and wherein the light absorption structures of multiple photovoltaic subcells of the plurality of photovoltaic subcells are optimized for different spectral ranges, and are laterally offset in the stack relative to an optical axis to avoid overlap; and a spectrally-dispersive optical element, the plurality of photovoltaic subcells of the stack being respectively located and aligned relative to the spectrally-dispersive optical element based, at least in part, on the respective spectral ranges of the subcells' light absorption structures.

In a further aspect, a method of fabricating a photovoltaic cell is provided, which includes: separately forming a plurality of photovoltaic subcells, each photovoltaic subcell including a subcell substrate, and a light absorption structure associated with the subcell substrate, the light absorption structure being optimized for a respective spectral range of incoming radiation, and wherein the light absorption structures of multiple photovoltaic subcells of the plurality of photovoltaic subcells are optimized for different spectral ranges; mechanically stacking the plurality of photovoltaic subcells, with the light absorption structures of multiple photovoltaic subcells of the plurality of photovoltaic subcells being offset in the stack relative to an optical axis to avoid overlap; and associating and aligning a spectrally-dispersive optical element with the stack, wherein the plurality of photovoltaic subcells of the stack are arranged, and respectively located and aligned relative to the spectrally-dispersive optical element based, at least in part, on the respective spectral ranges of the subcells' light absorption structures.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
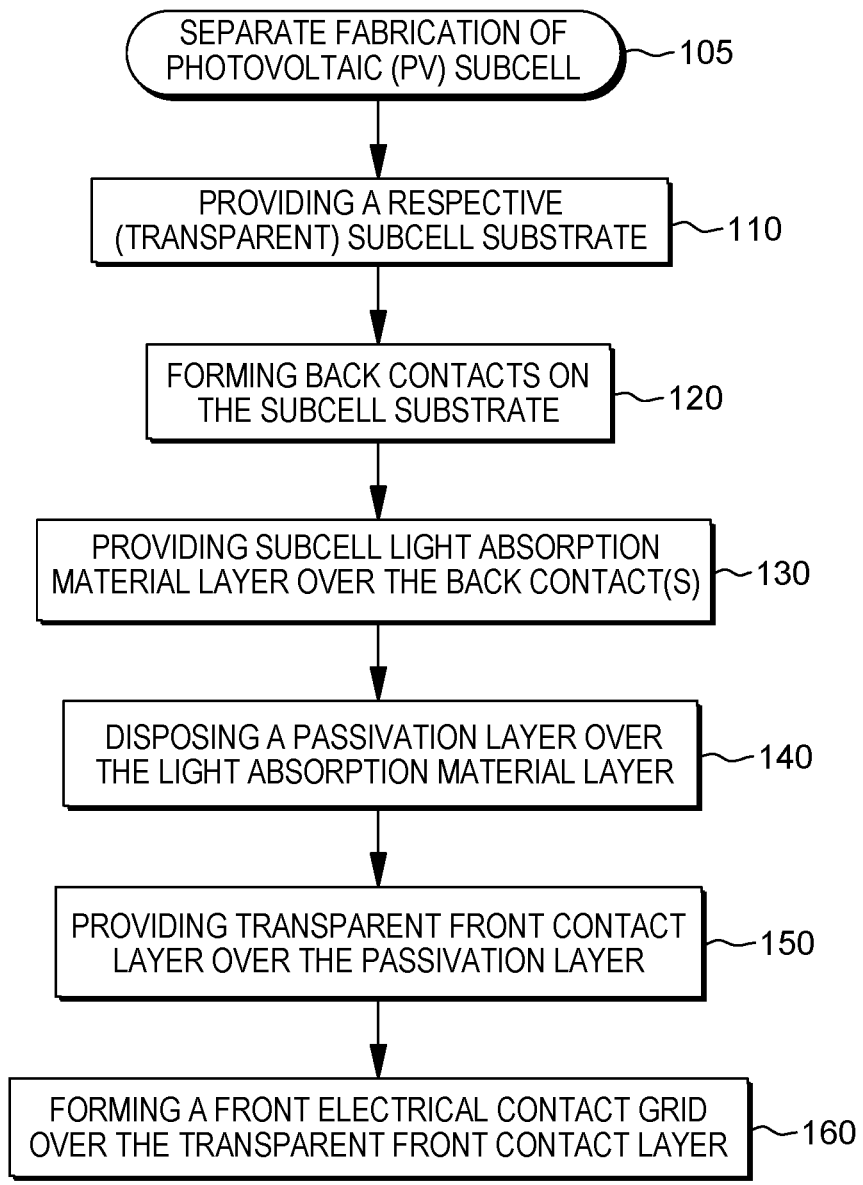
FIG. 1 depicts one embodiment of a process for separately fabricating photovoltaic subcells, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

As understood in the art, photovoltaics generally refers to converting solar energy into direct current electricity using semiconductor materials that exhibit the photovoltaic effect. A photovoltaic system employs solar panels comprising a number of photovoltaic cells to supply usable solar power. Current second generation solar or photovoltaic cells employ thin film semiconductor materials as the solar absorber or light absorption layer. A number of semiconductor materials have been proposed or used in thin film solar cells, including copper-indium-gallium-selenide (CIGS), copper-zinc-tin-sulfide/selenide (CZTS), cadmium telluride (CdTe), and organic- or inorganic-Perovskite, along with others. Conventional thin film photovoltaic cells include an absorber material disposed between an ohmic contact and a transparent contact, which allows light to reach the absorber layer.

One way to reduce cost of energy for photovoltaic cell systems is to improve efficiency of the system. The highest conversion efficiencies today are achieved with solar cells which are formed as multi-layer, multi-junction devices. Such solar cells are typically monolithically formed, and relatively costly to fabricate, partially due to the expensive materials employed, and complex processing required to fabricate the monolithic structures involved. For instance, monolithic, multi-layer, multi-junction solar cells can be expensive to produce due to the requirement of matching crystal structures, as well as the electrical and optical properties of the different junctions. Additionally, problems with producing monolithic, thin-film, multi-junction solar cells include the lack of suitable absorption materials for spectral sub-bands, and the difficulties in processing subsequent layers as absorber layers that must be partially transparent, and contact layers that must be transparent as well.

In order to circumvent these issues, the light absorption material can be placed side-by-side, within a configuration that utilizes a spectral-splitting, optical refractive or reflective element, such as in a lateral multi-junction solar cell. Utilizing thin-film compound semiconductor absorbers, with tunable band gaps is a promising approach to designing individual subcell absorbers. However, manufacturing of different absorber stoichiometries on one substrate is not straightforward. Although such structures have certain advantages, it is highly desirable to arrive at a multi-junction solar cell using a more cost effective process, such as using a thin-film manufacturing process, for instance, roll-to-roll manufacturing.

Disclosed herein is the concept of mechanically stacking separately produced photovoltaic subcells to arrive at a lateral multi-junction photovoltaic solar cell. The electrical design of the disclosed cell advantageously avoids the current matching problem with state of the art monocrystalline multi-junction solar cells.

In particular, presented herein are lateral multi-junction photovoltaic cells, photovoltaic devices, and methods of fabrication, which utilize mechanical stacking of separately formed photovoltaic subcells. This advantageously allows for the subcells to be formed from laterally-varying, light absorbing materials, and/or with laterally-varying, light absorbing properties, that is, from different bandgap materials. Advantageously, different light absorbing materials with different band gaps may be readily integrated into a single, lateral multi-junction photovoltaic cell. Thin-film materials may also be employed to produce thin-film photovoltaic subcells on separate subcell substrates, which are then mechanically stacked in a suitable alignment and arrangement, for instance, relative to a spectrally-dispersive optical element, which spectrum-splits incoming radiation into bands, and directs the radiation bands towards the respective, suitable absorber material of the stacked photovoltaic subcells.

As one example, the absorber materials, or more generally, light absorption structures, of the photovoltaic subcells may be provided in the form of stripes on respective substrates, with the stripes then being located and aligned relative to the optical element so that spectral radiation bands not absorbed in a specific photovoltaic subcell layer are transmitted through the subcells' transparent substrate, and directed towards a lower absorber stripe in the stack of photovoltaic cells. In this manner, a number of suitable spectral bands, such as two, three, four, five, six . . . from blue to red, and suitable light absorption structures, may be used to arrive at a setup for a lateral multi-junction solar cell. The mechanical stacking of the thin, photovoltaic subcells results in a quasi-side-by-side, lateral multi-junction solar cell, where the light absorption structures, comprising, for instance, absorber stripes, are offset laterally in the stack relative to an optical axis to, for instance, avoid overlap and shadowing of an upper absorber relative to a lower absorber in the stack. The individual transparent substrates may be manufactured independently from each other, for instance, of the same or different materials, with the same or different thicknesses, and possibly not require a transparent contact. This allows integration of very different material systems, such as CIGS, CIGSSe, CZTS, CZTSSe, CdTe, Perovskite, CdHgTe, CuLnGa (SeS$_2$), MAPb, Si, GaAs, InGaN, InGaP, etc., into a single photovoltaic cell.

Generally stated, disclosed herein are photovoltaic cells, and methods of fabrication thereof, which include: a plurality of photovoltaic subcells, and a spectrally-dispersive optical element. The plurality of photovoltaic subcells are separately formed and mechanically stacked together in a stack. The photovoltaic subcells may include: a subcell substrate; a light absorption structure associated with the subcell substrate, the light absorption structure being optimized for a respective spectral range of incoming radiation; and wherein the light absorption structures of multiple photovoltaic subcells of the plurality of photovoltaic subcells are optimized for different spectral ranges, and are offset laterally in the stack relative to an optical axis to avoid overlap in the direction of the optical axis. Further, the plurality of photovoltaic subcells of the stack are respectively located and aligned relative to the spectrally-dispersive optical element based, at least in part, on the respective spectral ranges of the subcells' light absorption structures.

In one or more embodiments, the light absorption structures of the multiple photovoltaic subcells of the plurality of photovoltaic subcells in the stack are further laterally offset relative to the optical axis to avoid one light absorption structure shadowing another light absorption structure of the multiple photovoltaic subcells. In certain embodiments, the light absorption structure of each photovoltaic subcell includes a respective light absorption material, with the light absorption material of multiple photovoltaic subcells of the plurality of photovoltaic subcells in the stack being optimized for absorbing different, defined spectral ranges of the incoming radiation. By way of example, at least two photovoltaic subcells of the plurality of photovoltaic subcells may comprise light absorption materials with different bandgaps. Further, in one or more embodiments, the respective light absorption material of at least one photovoltaic subcell in the stack may include a thin-film semiconductor material, with the thin-film semiconductor material having a thickness of 5 microns or less, and comprising, for instance, one of Si, GaAs, InGaN, InGaP, CIGS, CIGSSe, CZTS, CZTSSe, CdTe, or a hybrid organic-inorganic Perovskite material. In one or more implementations, the light absorption structure of each photovoltaic subcell may further include a back contact over one side of the respective light absorption material, and a transparent front contact over an opposite side of the respective light absorption material from the back contact.

In implementation, the light absorption structures of different photovoltaic subcells of the plurality of photovoltaic subcells mechanically stacked in the stack may be vertically offset in the stack, in addition to being laterally offset in the direction of the optical axis. By way of example, the light absorption structure of each photovoltaic subcell may be formed as a stripe on a respective subcell substrate, and the plurality of photovoltaic subcells may be mechanically stacked and arranged in the stack relative to the optical axis for the light absorption structure thereof to receive a respective band of radiation from the spectrally-dispersive optical element. In implementation, the subcell substrate of one or more photovoltaic subcells may be, for instance, a transparent substrate, such as a glass substrate, a polymer substrate, etc., having a thickness less than 100 µms, such as 70 µms, or less. In certain implementations, a polymer film may be provided between adjacent photovoltaic subcells of the plurality of photovoltaic subcells to facilitate securing together the adjacent subcells in the stack.

Reference is made below to the drawings, which are not drawn to scale for ease of understanding, wherein the same reference numbers used throughout different figures designate the same or similar components.

FIG. 1 illustrates one embodiment of a fabrication process 100 for separately fabricating a photovoltaic (PV) subcell 105. As noted, in accordance with the present invention, a plurality of photovoltaic subcells are separately fabricated, and then mechanically stacked to facilitate forming a lateral multi-junction photovoltaic cell, such as disclosed herein. The fabrication process 100 for a photovoltaic subcell may include providing a respective subcell substrate 110. In one or more implementations, the subcell substrate may be a transparent substrate, such as a thin glass substrate or a thin polymer substrate. By way of specific example, the subcell substrate could comprise Willow® glass, offered by Corning Incorporated, of Corning, N.Y. (USA), or an ultrathin glass foil, such as AF32 eco or D263T eco, offered by SCHOTT North America, Inc., of Duryea, Pa. (USA). The thickness of this glass may be, for instance, 100 µms, or less, such as in the range of 25-70 µms, and the glass has good optical transmission properties. Generally, the thickness of the subcell substrate 100 might depend, in part, on the material used, and/or the processing employed or the design of the substrate. For instance, a glass foil may be provided having a substrate thickness in the 10-20 µm range, or alternatively, a desired form factor for the photovoltaic cell might limit the substrate material thickness to, for instance, 500 µms, or less, such as in the range of 25-200 µms.

One or more back contacts may be formed on the subcell substrate as part of forming one or more identical light absorption structures on the substrate 120. Note in this regard, that although describing fabrication of a photovoltaic subcell for forming a lateral multi-junction photovoltaic cell, that the photovoltaic subcell processing described may be employed to manufacture in parallel a plurality of lateral multi-junction photovoltaic cells for, for instance, a solar panel or other solar device. Thus, each separately fabricated photovoltaic subcell may include a plurality of light absorption structures, each substantially identically formed, but offset a predefined distance on the subcell substrate to, for instance, facilitate fabrication of a photovoltaic device comprising multiple lateral, multi-junction photovoltaic cells, as described herein.

The fabricating further includes, for instance, providing the subcells' light absorption material layer over the back contact(s) 130, depositing a passivation layer over the light absorption material layer 140, and providing a transparent front contact(s) over the passivation layer 150. A front electrical contact grid may then be formed over the transparent front contact layer 160 to facilitate electrical connection to the light absorption structure.

FIGS. 2A-2D depict a detailed example of fabricating a photovoltaic subcell using, for instance, the photovoltaic subcell fabrication process of FIG. 1. Note that although illustrated as fabricating a single light absorption structure over the subcell substrate, that the process may form in parallel a plurality of identical light absorption structures over the subcell substrate, each offset a predefined distance, for instance, to allow for parallel fabrication of a plurality of lateral multi-junction photovoltaic cells of a photovoltaic device, as might be desired, for instance, in the formation of a solar panel or other solar device.

Figure 2A:
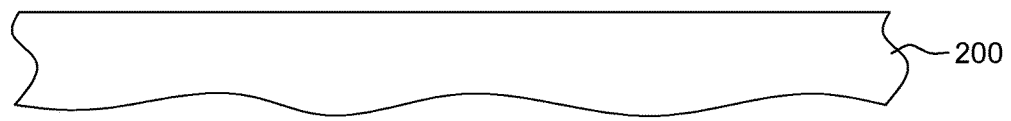
FIGS. 2A-2D depict one detailed embodiment of an exemplary photovoltaic subcell being fabricated, in accordance with one or more aspects of the present invention.

Referring to FIG. 2A, a subcell substrate 200 is provided that is, at least in part, transparent to allow light to pass through the subcell substrate. As examples, subcell substrate 200 may include a glass substrate, a polymer substrate, a transparent foil substrate, etc. In one or more implementations, the subcell substrate has a thickness of approximately 100 µms or less, such as a thickness in the range of 25-70 µms, or less. By way of specific example, the above-noted Willow® glass from Corning Incorporated, or the noted glass foil offerings from SCHOTT North America, Inc., may be employed as the subcell substrate. Note that the extent of desired transparently may depend on a pre-specified position for the photovoltaic subcell in the lateral multi-junction photovoltaic cell being fabricated. For instance, if the photovoltaic subcell is pre-specified to be the lowest-most subcell when stacked in the lateral multi-junction photovoltaic cell, then that subcell's substrate need not be transparent.

Figure 2B:
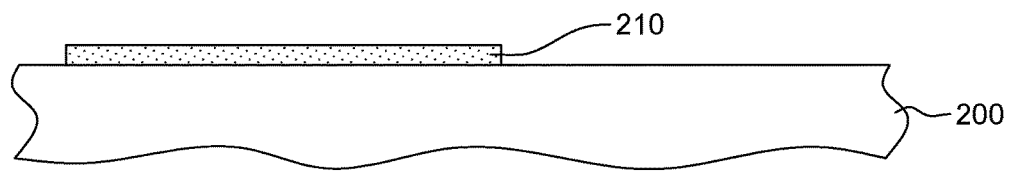

FIG. 2B depicts the structure of FIG. 2A, after provision of a back contact 210 over substrate 200. The back contacts 210 may be formed, for instance, by depositing and planarizing an appropriate back contact material or materials, such as Mo, MoZnO, ZnOAl, etc., for example, using a suitable mask. Alternatively, the back contact material could be conformally applied, and then removed using, for instance, laser desorption. In another approach, the contact material could be deposited from a liquid phase and printed onto the subcell substrate in the desired areas, leaving space between back contacts, as depicted (for instance) in the photovoltaic subcell examples of FIGS. 3A-3D.

Figure 2C:
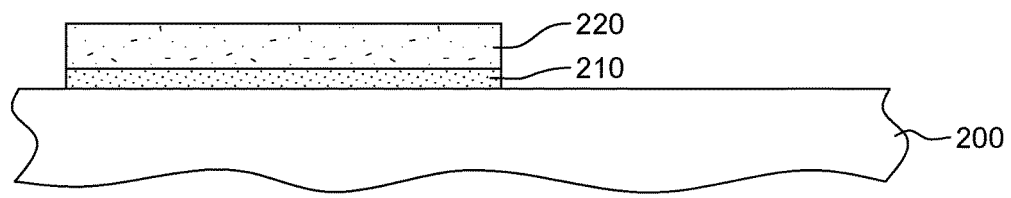

FIG. 2C depicts the structure of FIG. 2B, after provision of a light absorption layer 220 over back contact 210. Light absorption layer 220 includes opposite first and second surfaces, with a first surface residing, in the depicted example, in direct contact with back contact 210. Note that in alternate configurations, one or more passivating layers may be disposed between light absorption layer 220 and back contact 210. Light absorption layer 220 may be formed of a wide variety of semiconductor materials and compositions which are light-absorbing. By way of example, the light-absorbing material could be, or include, copper-indium-gallium-selenide/sulfide (CIGS), copper-zinc-tin-sulfide (CZTS), cadmium telluride (CdTe), organic- or inorganic-Perovskite, CdHgTe, CIGSSe (CuInGa(Se,S)2), CZTSSe, MAPb, Si, etc., and be deposited using, for instance, methods known in the art for thin-film deposition or creation, such as co-evaporation, sputtering, electro-deposition, printing, transfer printing, etc. There are many known process variants to growing or depositing a suitable light absorption layer 220. In one or more fabrication approaches, once an absorber precursor is deposited, the structure may be annealed, for instance, at a temperature of about 550° C., to cause a gas reaction of the absorber material, thereby achieving the desired material composition and/or structure. The annealing may advantageously result in recrystallization or, if metallic precursors are deposited, reaction of the precursors with a further element from the gas phase (for example, deposit Cu+In+Ga, anneal and H2Se, H2S) to form the semiconductor material. Note also that the annealing can be performed otherwise, such as by rapid thermal processing, or laser annealing, if desired.

Figure 2D:
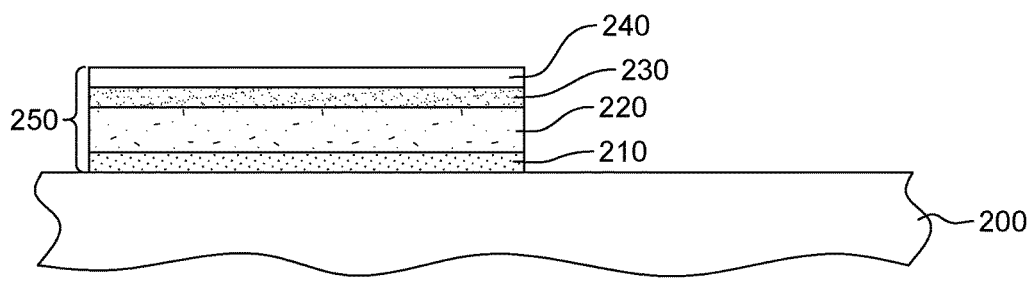
Figure 3A:
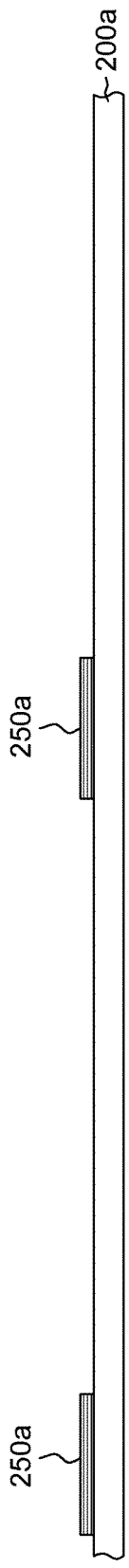
FIGS. 3A-3D depict different exemplary photovoltaic subcells separately fabricated, in accordance with one or more aspects of the present invention.
Figure 3B:
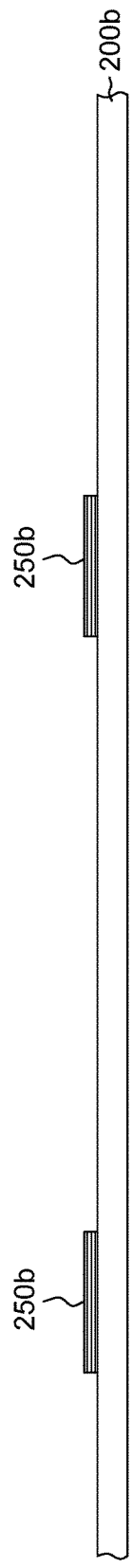
Figure 3C:
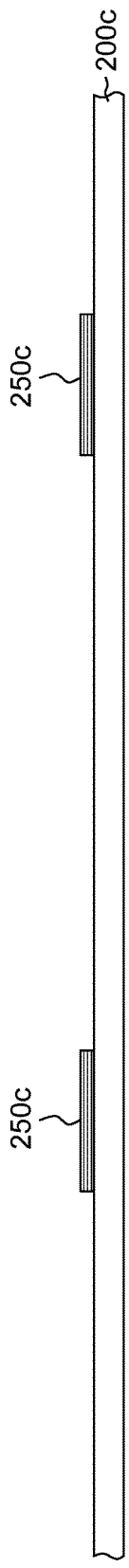
Figure 3D:
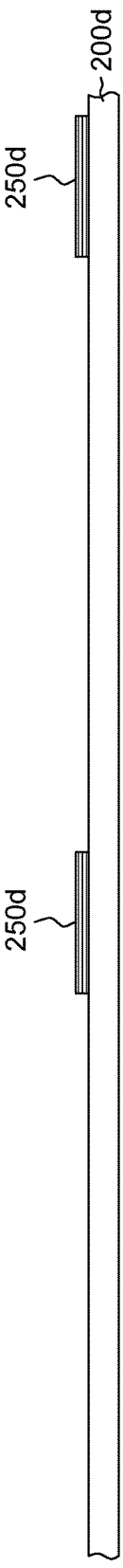

As illustrated in FIG. 2D, a passivation layer 230 may be deposited over the second surface of light absorption layer 220, and a front contact 240 may be provided over passivation layer 230. In one or more implementations, passivation layer 230 may be an antireflective and passivating layer, and may comprise, for instance, $Al_2O_3$, $MgF_2$, or other passivating material(s). By way of example, front contact 240 may be formed of a transparent conducting oxide, such as, for instance, ZnO.

Note that the thicknesses of the layers of the structure 250 of FIG. 2D may vary, for instance, as desired for a particular application. By way of example, substrate 200 may have a thickness of 150 μms, or less, such as 100 μms, or less. Back contact 210 and front contact 240 may each have a thickness in the range of 0.5-2.0 μms. Light absorption layer 220 may have a thickness of, for instance, 5 μms or less, such as in the range of 0.5-2.0 μms, and surface passivation layer 230 may have a thickness in the range of 5-15 nanometers. As a specific example, the back contact may have a thickness of 0.7-2 μms, the light absorption layer may be in the range of 0.5-5 μms, the passivation layer might be 0.7-1.5 μms, and the front contact 0.5-2 μms, resulting in a light absorption structure or stack having a total thickness of 5-10 μms. Note that the thicknesses of the layers depicted in FIG. 2D are provided by way of example only, and not by way of limitation. For instance, if an absorber material other than a thin-film absorption material is employed within light absorption structure 250, then thickness of light absorption layer 230 may increase.

FIGS. 3A-3D depict several separately formed, exemplary photovoltaic subcells, each of which includes multiple light absorption structures 250a, 250b, 250c, 250d, formed over a respective subcell substrate 200a, 200b, 200c, 200d. Note in this regard, in one or more implementations, each light absorber structure 250a on subcell substrate 200a is substantially identical, and the light absorption structures 250a include different light absorption materials and/or compositions from the light absorption materials/compositions employed in the other light absorption structures 250b, 250c, 250d. For instance, as described herein, the light absorption materials themselves, or their compositions, may vary in order to achieve different characteristics, for instance, to optimize each type of light absorption structure 250a, 250b, 250c, 250d, for absorbing a different respective spectral range of incoming radiation provided by the associated spectrally-dispersive optical element. Note also that the location of the individual light absorption structures may be pre-specified to allow for the photovoltaic subcell substrates to be located and aligned relative to the spectrally-dispersive optical element when the subcells are mechanically stacked together in a stack, as described herein. Advantageously, since the photovoltaic subcells depicted in FIGS. 3A-3D are separately formed, one or more of the materials, compositions, fabrication processes, etc., may be readily varied between the subcells to vary the light absorption characteristics of the structures. That is, since the individual subcell substrates and light absorption structures are formed or manufactured independently from each other, different material systems may be readily employed in their fabrication. For instance, the fabrication approach disclosed herein advantageously facilitates integrating different absorber materials and/or absorber compositions into the different layers of the resultant lateral multi-junction photovoltaic cell.

Figure 4:
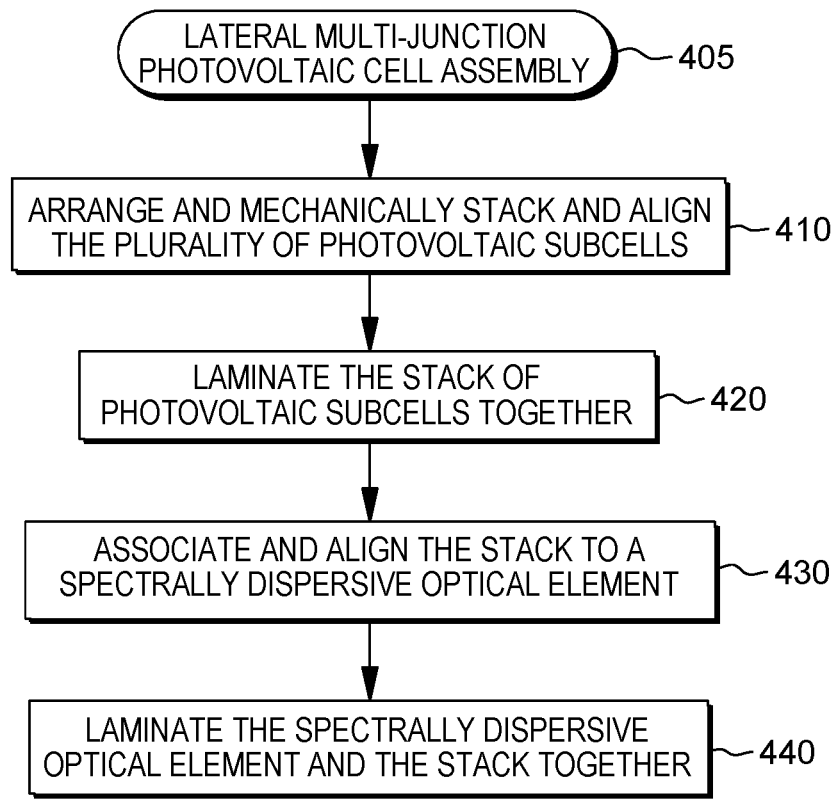
FIG. 4 depicts one embodiment of a process of fabricating a lateral multi-junction photovoltaic cell using mechanical stacking of a plurality of separately fabricated photovoltaic subcells, in accordance with one or more aspects of the present invention.

FIG. 4 depicts one embodiment of a fabrication process 400 for providing a lateral, multi-junction photovoltaic cell assembly 405, which includes arranging and mechanically stacking and aligning a plurality of photovoltaic subcells 410 in a stack. One example of this process is depicted in FIGS. 5A-5C.

Figure 5A:
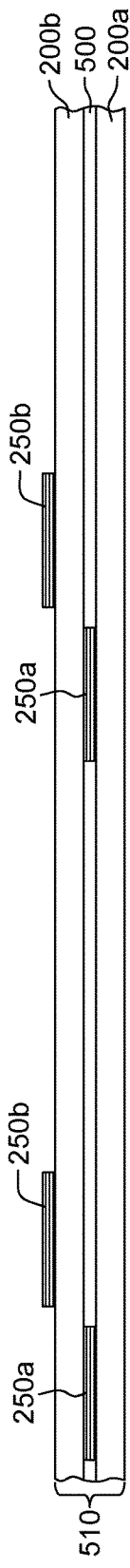
FIGS. 5A-5C partially depict an exemplary lateral multi-junction photovoltaic cell being fabricated, in accordance with one or more aspects of the present invention.

Referring initially to FIG. 5A, two photovoltaic subcells are shown mechanically stacked and aligned (using, for instance, an automated tool) such that light absorption structures 250a and 250b of the subcells are laterally offset in the stack 510 relative to an optical axis of the cell to avoid overlap. Note in this regard, that the optical axis or direction 601 (FIG. 6A) may be, for instance, a vertical, downward direction through the stack in the embodiments depicted. In addition to avoiding overlap, the light absorption structures 250a and 250b may be arranged relative to the direction of the optical axis to avoid one light absorption structure shadowing another light absorption structure, as noted further below with reference to FIGS. 6A & 6B. In one or more implementations, a thin gap 500, such as an air gap, may be provided between adjacent subcell substrates 200a, 200b from the mechanical stacking. This gap 500 will have a thickness which equates to the height of the light absorption structures, such as structures 250a. In one or more other implementations, a material, such as a thin polymer film, may fill gap 500 between adjacent photovoltaic subcell substrates, for instance, to facilitate securing together adjacent photovoltaic subcells in the stack.

Figure 5B:
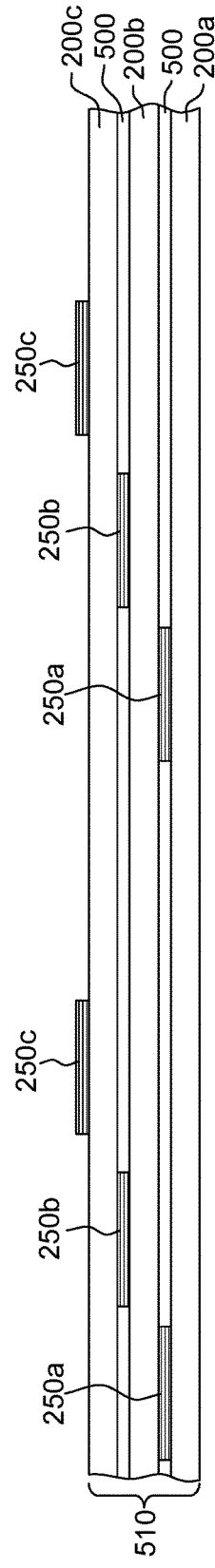
Figure 5C:
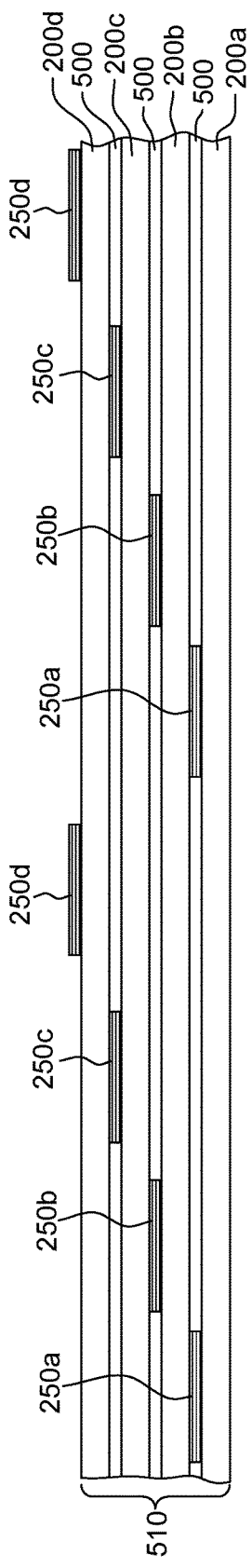

FIG. 5B depicts the structure of FIG. 5A after mechanical stacking of another photovoltaic subcell comprising substrate 200c and light absorption structures 250c onto the stack, and FIG. 5C depicts an exemplary stack 510 obtained from mechanical stacking a further photovoltaic subcell comprising substrate 200d and light absorption structures 250d onto the structure of FIG. 5B. Note that the four subcell stack 510 embodiment of FIGS. 5A-5C is provided by way of example only. For instance, there may be more or less than four photovoltaic subcell layers in the stack. By way of specific example, in the four subcell example of FIG. 5C, the absorption material of light absorption structures 250a may be optimized for a blue light spectral range of radiation wavelength, the absorption material of light absorption structure 250b may be optimized for a green light spectral range, and the absorption material for light absorption structures 250c and 250d may be respectively optimized for a yellow light and red light spectral range.

Returning to the fabrication process of FIG. 4, after mechanically stacking and aligning the photovoltaic subcells 410, the stack of photovoltaic subcells may be laminated together in a package 420, which may include providing appropriate electrical connection from the individual light absorption structures of the subcells out to, for instance, one or more energy-conversion units. The laminated stack is then associated with and aligned to a spectrally-dispersive optical element 430, which is provided to, for instance, form a rainbow spectrum of light extending laterally outward, for instance, approximately 3-5 cm. Note in this regard, the dimensions of the photovoltaic subcells, in one or more embodiments, may depend on the output of the spectrally-dispersive optical element utilized. For instance, in one or more implementations, the width of the photovoltaic subcell layer, and in particular, the light absorption structures, may be determined by the optically-dispersive element employed. For example, if incoming radiation is sub-divided so that five different light absorption structures are to be utilized, then each light absorption structure, or more particularly, light absorption material, may be approximately one centimeter in width (less a small gap between the subcells), meaning that the resultant photovoltaic cell may have a width on the order of five cms. If a spectrally-dispersive element is provided which concentrates light at the same time (such as a Fresnel-type lens), then the rainbow spectrum could have smaller dimensions, for instance, 300 μms, and the width of the respective light absorption structures might be smaller as well, for instance, in the range of 50-100 μms. Depending on the design of the spectrally-dispersive element, the sub-bands from the spectrally-dispersive and concentrating element could be spatially separated and distributed to, for example, subcells with widths of approximately 100 μms, and gaps in between that could be on the order of 1 cm, if desired. Once positioned relative to the laminated stack, the spectrally-dispersive optical element and the stack may be laminated together 440; that is, packaged as desired.

Figure 6A:
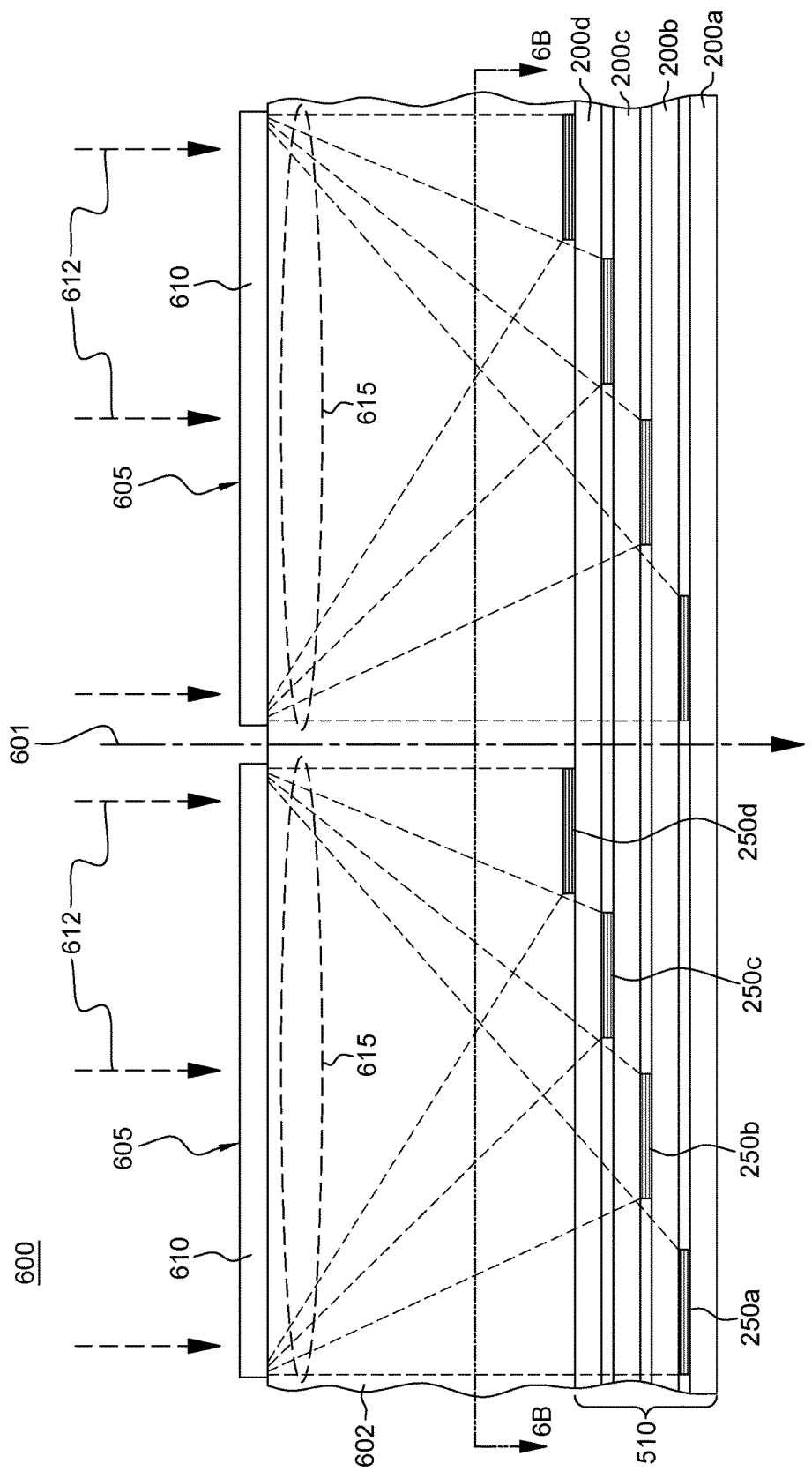
FIG. 6A is an elevational depiction of one embodiment of a photovoltaic device comprising, by way of example, two or more lateral multi-junction photovoltaic cells, in accordance with one or more aspects of the present invention.
Figure 6B:
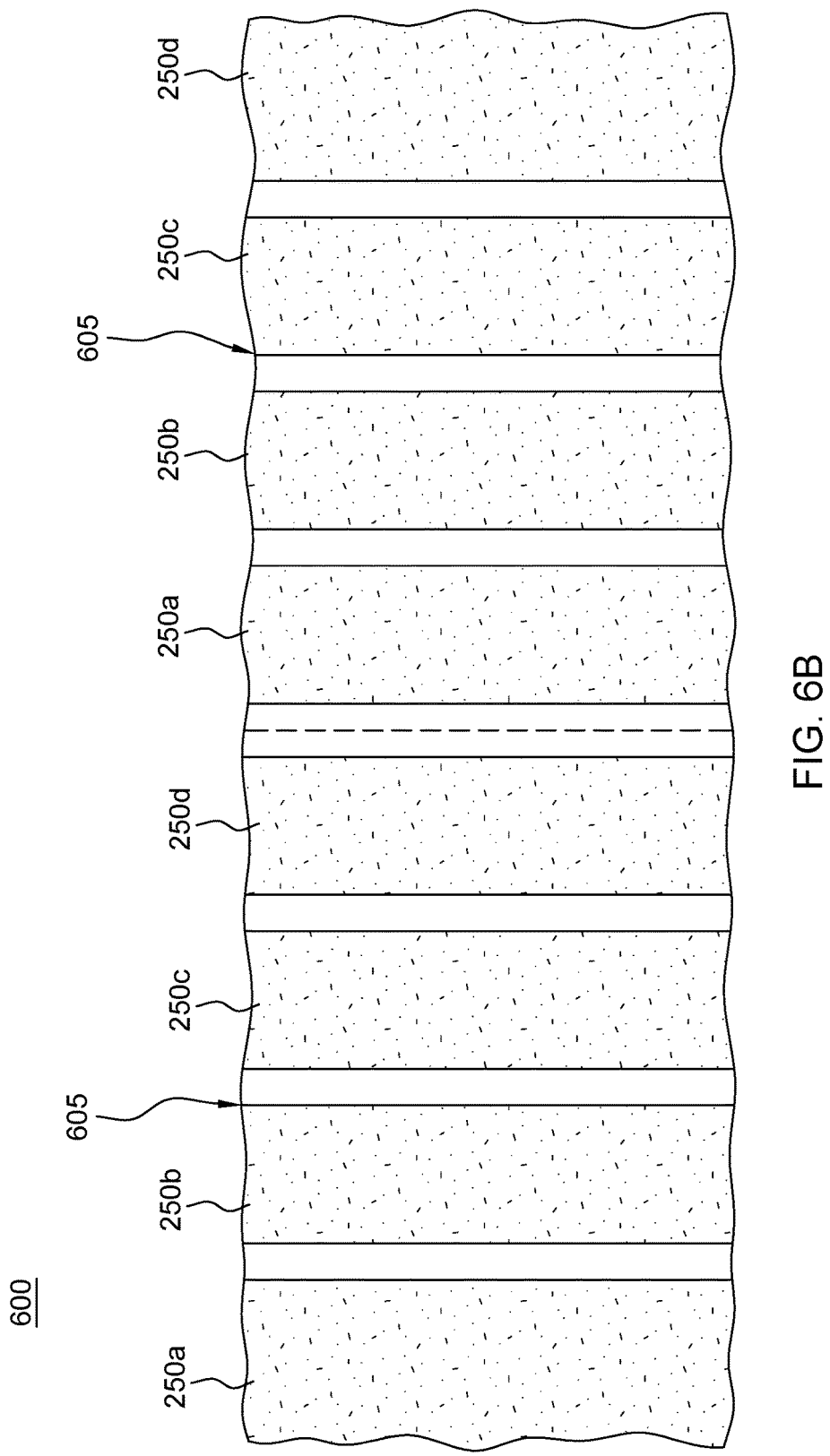
FIG. 6B is a cross-sectional plan view of the photovoltaic device of FIG. 6A, taken along line 6B-6B thereof, and illustrating by way of example, a stripe configuration of the light absorption structures of the plurality of photovoltaic subcells, in accordance with one or more aspects of the present invention.

FIGS. 6A-6B depict one example of a photovoltaic device 600 having multiple lateral multi-junction photovoltaic cells 605, in accordance with one or more aspects of the present invention.

As depicted in FIG. 6A, a stack of photovoltaic cells 510 is associated with and aligned relative to a spectrally-dispersive optical element 610 such that each light absorption structure 250*a*, 250*b*, 250*c*, 250*d*, is offset laterally in the stack relative to the optical axis to avoid overlap and shadowing. In one or more implementations, a space 602 between photovoltaic cell stack 510 and spectrally-dispersive optical element 610 is provided to accommodate the spectral ranges 615, and may be, for instance, an air gap, or alternatively, may comprise a transparent material, such as glass or a transparent polymer material.

As noted, the light absorption material within the individual light absorption structures 250*a*, 250*b*, 250*c*, 250*d*, may be optimized to absorb a respective, defined spectral range of the incumbent radiation. In the example illustrated, four spectral ranges 615 are depicted, impinging upon the respective light absorption structures 250*a*-250*d*. In operation, optical element 610 refracts incoming radiation 612, providing spectral ranges 615 which are each focused towards a respective light absorption structure 250*a*-250*d*. The configuration depicted may be multiplied across a large area, with the number of lateral multi-junction photovoltaic cells 605 in device 600 being as large as desired, for instance, for a particular solar panel or other solar device. Note also that the number of photovoltaic subcells is not limited to four subcells, as in the example described, but may be chosen in accordance with a particular application to, for instance, optimize or balance costs of the resultant photovoltaic device with efficiency of the system. Each subcell may be electrically connected to via conductive lines, for instance, on substrates 200*a*-200*d*, and may be connected to electrical conversion units optimized for each IV-curve of the photovoltaic subcells' absorption material.

By way of example, FIG. 6B is a cross-sectional plan view of the photovoltaic device 600 of FIG. 6A, illustrating provision of the light absorption structures 250*a*-250*d*, as substantially parallel stripes within the respective lateral multi-junction photovoltaic cell 605. Note, however, that other light absorption structure configurations may be provided within the stack, if desired.

Those skilled in the art will note from the description provided herein that a novel, quasi-side-by-side placement of photovoltaic subcells in a mechanically stacked geometry is provided for a lateral multi-junction photovoltaic cell. Advantageously, discrete light absorption structures are separately manufactured on different subcell substrates, such as in a thin-film process, with the individual subcell substrates themselves being thin and substantially transparent, in one or more implementations. Advantageously, the fabrication approach and resultant structures described herein allow for increasing the number of junctions above three or four, allowing, for instance, full spectrum photovoltaic cells, as well as minimizing thermalization losses. Note in this regard that thermalization losses are minimized by separating the spectrum into sub-bands. By increasing the number of sub-bands, and number of photovoltaic subcells or light absorption structures, the impact of thermalization is reduced accordingly. This becomes even more so when reducing the spectral width of each sub-band provided by the spectrally-dispersive optical element. The spectrally-dispersive optical element functions as a filter, adjusting each wavelength band towards a respective light absorption material with a bandgap. In this manner, thermalization losses by photons with higher energy than necessary for the respective bandgap are minimized.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A lateral multi-junction photovoltaic cell comprising:
a plurality of photovoltaic subcells, the plurality of photovoltaic subcells being arranged in multiple layers, one layer on top of another layer, in a stack of photovoltaic subcells, each photovoltaic subcell in the stack including:
   a respective subcell substrate; and
   a light absorption structure associated with the respective subcell substrate, the light absorption structure being optimized to absorb a respective spectral range of radiation;
wherein the light absorption structures of multiple photovoltaic subcells of the plurality of photovoltaic subcells in the stack are optimized for different spectral ranges, with each light absorption structure in the stack being laterally offset, relative to an optical axis, from a light absorption structure of a vertically adjacent photovoltaic subcell in the stack of photovoltaic subcells to avoid any overlap of light absorption structures of vertically adjacent photovoltaic subcells in the stack, and to avoid shadowing of an upper light absorption structure relative to a lower light absorption structure in the stack, and at least one light absorption structure in the stack is supported on a main surface by its subcell substrate and contacted on an other main surface by another subcell substrate of a different photovoltaic subcell of the plurality of photovoltaic subcells in the stack, where the main surface and the other main surface are opposite main sides of the at least one light absorption structure; and
a spectrally-dispersive optical element across which incoming radiation is filtered, the spectrally-dispersive optical element spectrum-splitting the incoming radiation, at the spectrally dispersive optical element, into different radiation bands, and directing each of the different radiation bands towards a different respective light absorption structure of the light absorption structures of the plurality of photovoltaic subcells in the stack, the respective light absorption structures having different bandgap materials each optimized for a respective radiation band of the different radiation bands, and each photovoltaic subcell of the plurality of photovoltaic subcells in the stack being located and aligned in a respective layer of the multiple layers of the stack relative to the spectrally-dispersive optical element based, at least in part, on where the different radiation bands spectrum-split from the incoming radiation by the spectrally-dispersive optical element are located and the respective spectral ranges of the subcells' light absorption structures.

2. The lateral multi-junction photovoltaic cell of claim 1, wherein the respective light absorption structures' different bandgap materials comprise a thin film semiconductor material, the thin film semiconductor material having a thickness of 5 microns or less, and comprise one of Si, GaAs, InGaN, InGaP, copper-indium-gallium-selenide (CIGS), copper-zinc-tin-sulfide (CZTS), cadmium telluride (CdTe), or a hybrid organic-inorganic Perovskite material.

3. The lateral multi-junction photovoltaic cell of claim 1, wherein the plurality of photovoltaic subcells includes at least three photovoltaic subcells, and wherein multiple light absorption structures of the plurality of photovoltaic subcells within the stack of photovoltaic subcells comprise different bandgap materials.

4. The lateral multi-junction photovoltaic cell of claim 1, wherein the at least one light absorption structure in the stack comprises a back contact over the main surface of the respective light absorption material, and a transparent front contact over the other main surface of the at least one light absorption structure in the stack.

5. The lateral multi-junction photovoltaic cell of claim 1, wherein the light absorption structure of each photovoltaic subcell is formed as a stripe on the respective subcell substrate, and the plurality of photovoltaic subcells are mechanically stacked and arrayed in the stack relative to the optical axis for the light absorption structure thereof to receive a respective spectral band of radiation from the spectrally-dispersive optical element.

6. The lateral multi-junction photovoltaic cell of claim 1, wherein the subcell substrate of each photovoltaic subcell of multiple photovoltaic subcells in the stack is a transparent substrate.

7. The lateral multi-junction photovoltaic cell of claim 1, further comprising a polymer film between adjacent photovoltaic subcells of the plurality of photovoltaic subcells, the polymer film facilitating securing together the adjacent photovoltaic subcells in the stack.

8. A photovoltaic device comprising:
at least one lateral multi-junction photovoltaic cell, the at least one lateral multi-junction photovoltaic cell of the photovoltaic device comprising:
   a plurality of photovoltaic subcells, the plurality of photovoltaic subcells being arranged in multiple layers, one layer on top of another layer, in a stack of photovoltaic subcells, each photovoltaic subcell in the stack including:
      a respective subcell substrate; and
      a light absorption structure associated with the respective subcell substrate, the light absorption structure being optimized to absorb a respective spectral range of radiation;
   wherein the light absorption structures of multiple photovoltaic subcells of the plurality of photovoltaic subcells in the stack are optimized for different spectral ranges, with each light absorption structure in the stack being laterally offset, relative to an optical axis, from a light absorption structure of a vertically adjacent photovoltaic subcell in the stack of photovoltaic subcells to avoid any overlap of light absorption structures of vertically adjacent photovoltaic subcells in the stack, and to avoid shadowing of an upper light absorption structure relative to a lower light absorption structure in the stack, and at least one light absorption structure in the stack is supported on a main surface by its subcell substrate and contacted on an other main surface by another subcell substrate of a different photovoltaic subcell of the plurality of photovoltaic subcells in the stack, where the main surface and the other main surface are opposite main sides of the at least one light absorption structure; and
   a spectrally-dispersive optical element across which incoming radiation is filtered, the spectrally-dispersive optical element spectrum-splitting the incoming radiation, at the spectrally dispersive optical element, into different radiation bands, and directing each of the different radiation bands towards a different respective light absorption structure of the light absorption structures of the plurality of photovoltaic subcells in the stack, the respective light absorption structures having different bandgap materials each optimized for a respective radiation band of the different radiation bands, and each photovoltaic subcell of the plurality of photovoltaic subcells in the stack being located and aligned in a respective layer of the multiple layers of the stack relative to the spectrally-dispersive optical element based, at least in part, on where the different radiation bands spectrum-split from the incoming radiation by the spectrally-dispersive optical element are located and the respective spectral ranges of the subcells' light absorption structures.

9. The photovoltaic device of claim 8, wherein the light absorption structures of the multiple photovoltaic subcells of the plurality of photovoltaic subcells in the stack are further laterally offset relative to the optical axis to avoid one light absorption structure shadowing another light absorption structure of the multiple photovoltaic subcells.

10. The photovoltaic device of claim 8, wherein the respective light absorption structures' different bandgap materials comprise a thin film semiconductor material, the thin film semiconductor material having a thickness of 5 microns or less, and comprise one of Si, GaAs, InGaN, InGaP, copper-indium-gallium-selenide (CIGS), copper-zinc-tin-sulfide (CZTS), cadmium telluride (CdTe), or a hybrid organic-inorganic Perovskite material.

11. The photovoltaic device of claim 8, wherein the plurality of photovoltaic subcells includes at least three photovoltaic subcells, and wherein multiple light absorption structures of the plurality of photovoltaic subcells within the stack of comprise different bandgap materials.

12. The photovoltaic device of claim 8, wherein the subcell substrate of each photovoltaic subcell of multiple photovoltaic subcells in the stack is a transparent substrate.

13. The lateral multi-junction photovoltaic cell of claim 1, wherein the different radiation bands include more than two radiation bands.

14. The photovoltaic device of claim 8, wherein the different radiation bands include more than two radiation bands.

15. The lateral multi-junction photovoltaic cell of claim 1, wherein each light absorption structure comprises a light absorption layer, a passivation layer, a front contact layer, and a back contact layer.

16. The lateral multi-junction photovoltaic cell of claim 15, further comprising a front electrical contact grid, the front electrical contact grid to facilitate electrical connection to the light absorption structure.

17. The lateral multi-junction photovoltaic cell of claim 1, wherein each photovoltaic subcell of the plurality of photovoltaic subcells includes a plurality of light absorption structures, each of the plurality of light absorption structures being offset a predefined distance on a respective subcell substrate.

* * * * *